United States Patent
Kim et al.

(10) Patent No.: US 7,202,099 B2
(45) Date of Patent: Apr. 10, 2007

(54) METHOD OF FABRICATING A LASER DIODE THAT INCLUDES THERMALLY CLEANING A DEPOSITION REACTOR USING A GAS MIXTURE OF ARSINE AND HYDROGEN

(75) Inventors: Ki-sung Kim, Gyeonggi-do (KR); Yong-jo Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 321 days.

(21) Appl. No.: 11/000,895

(22) Filed: Dec. 2, 2004

(65) Prior Publication Data
US 2005/0106766 A1    May 19, 2005

(30) Foreign Application Priority Data
Jun. 30, 2004    (KR) .................... 10-2004-0050480

(51) Int. Cl.
*H01L 21/00*    (2006.01)
(52) U.S. Cl. ......................... 438/47; 438/905
(58) Field of Classification Search .............. 438/905
See application file for complete search history.

(56) References Cited

U.S. PATENT DOCUMENTS 4,965,224 A * 10/1990 Horikawa et al. ............ 117/95
6,597,112 B1 * 7/2003 Sillmon ........................ 313/542
2004/0147052 A1 * 7/2004 Takeuchi et al. .............. 438/29
2006/0021564 A1 * 2/2006 Norman et al. ............... 117/84

OTHER PUBLICATIONS

Masahiko Kondow et al., "GaInNAs: A Novel Material for Long-Wavelength-Range Laser Diodes with Excellent High-Temperature Performance", Jpn. J. Appl. Phys. vol. 35 (1996) pp. 1273-1275, Part 1, No. 2B, Feb. 1996.
Tetsuya Takeuchi et al., "Al Contamination in InGaAsN Quantum Wells Grown by Metalorganic Chemical Vapor Deposition and 1.3 μm InGaAsN Vertical Cavity Surface Emitting Lasers", Japanese Journal of Applied Physics, vol. 43, No. 4A, 2004, pp. 1260-1263, 2004 The Japan Society of Applied Physics.

* cited by examiner

*Primary Examiner*—Stephen W. Smoot
(74) *Attorney, Agent, or Firm*—Buchanan Ingersoll & Rooney PC

(57) ABSTRACT

Provided is a method of fabricating a laser diode including a lower Al-containing semiconductor material layer, a active layer, and an upper Al-containing semiconductor material layer. The method includes thermally cleaning the inside of a deposition reactor in which a substrate on which the lower Al-containing semiconductor material layer is stacked is loaded. During the thermal cleaning process, the inside of the deposition reactor is thermally treated at a predetermined temperature in an atmosphere of a gas mixture of $AsH_3$ and $H_2$ that is injected into the deposition reactor.

9 Claims, 5 Drawing Sheets

METHOD OF FABRICATING A LASER DIODE THAT INCLUDES THERMALLY CLEANING A DEPOSITION REACTOR USING A GAS MIXTURE OF ARSINE AND HYDROGEN

BACKGROUND OF THE INVENTION

This application claims the priority of Korean Patent Application No. 2004-50480, filed on Jun. 30, 2004 in the Korean Intellectual Property Office, the disclosure of which is incorporated herein in its entirety by reference.

1. Field of the Invention

The present invention relates to a method of fabricating a laser diode, and more particularly, to a method of fabricating a laser diode, which can improve the optical characteristics of an InGaAsN quantum well (QW) layer.

2. Description of the Related Art

Nowadays, extensive research for applications of optical devices has progressed along with developments in high-speed data communications in the field of broad technologies including laser printers, optical image storage, underground optical cable systems, and optical communications.

Owing to the increased demand for more rapid and economical communication systems, optical fibers having broad transmission bands in a longer wavelength have been developed. Currently, optical fibers used in the wavelength range of 1.3 to 1.5 μm or higher are being developed.

To enable high-speed data transmission using an optical fiber, a laser oscillation signal having a wavelength range that coincides with the broad transmission band of the optical fiber should be needed so as to convert data into optical signals.

As a result, a GaAs-based vertical cavity surface emitting laser (VCSEL) diode was proposed. Since the GaAs-based VCSEL diode is economical and easily combines optical fibers, it becomes essential to a transmitter that performs high-level data link.

In addition, a result that long-wavelength laser oscillation can be embodied by adding nitrogen to a GaAs-based VCSEL is described by M. Kondow et al. in "Jpn. J. Appl. Phys., vol. 35(1996), pp. 1273–1275, Part 1, No. 2B, InGaAsN: A Novel Material for Long-Wavelength-Range Laser Diodes with Excellent High-Temperature Performance."

After publishing the result of M. Kondow's research, laser diodes having the wavelength range of about 1.3 μm using InGaAsN have been laboriously developed in need of optical communication components used for metro area networks (MANs).

However, a recent paper describes that the optical characteristics of an InGaAsN QW layer are deteriorated due to the influence of Al (refer to Jpn. J. Appl. Phys., Vol. 43, No. 4A, 2004, pp. 1260–1263, "Al Contamination in InGaAsN Quantum Wells Grown by Metalorganic Chemical Vapor Deposition and 1.3 μm InGaAsN Vertical Cavity Surface Emitting Lasers").

FIG. 1 is a flowchart illustrating a method of fabricating a conventional laser diode.

Referring to FIG. 1, a substrate is loaded into a deposition reactor A in operation 2, and a semiconductor material layer including Al, i.e., a first AlGaAs clad layer is formed on the substrate in operation 4. Then, the substrate is conveyed to a deposition reactor B. Next, a first GaAs barrier layer is formed on the first AlGaAs clad layer in operation 5, and an InGaAsN QW layer is formed on the first GaAs barrier layer in operation 6. Thereafter, a second GaAs barrier layer is formed on the InGaAsN QW layer in operation 7, and a second AlGaAs clad layer is formed on the second GaAs barrier layer in operation 8.

Al may adversely affect the optical characteristics of an InGaAsN QW layer particularly when a process of forming a semiconductor material layer, such as an AlGaAs clad layer or a distributed brag reflection (DBR) layer, and a process of forming the InGaAsN QW layer on the semiconductor material layer are performed in a single deposition reactor.

This is because when the InGaAsN QW layer is formed, Al remaining in the deposition reactor combines with N that is a source element of the InGaAsN QW layer so that the optical characteristics of the InGaAsN QW layer are degraded.

Accordingly, to minimize the influence of Al on the optical characteristics of the InGaAsN QW layer, the semiconductor material layer, such as the AlGaAs clad layer or the DBR layer, and the InGaAsN QW layer are formed in separate deposition reactors, respectively.

Another method for avoiding the influence of Al is to periodically clean a deposition reactor. That is, to remove Al accumulated in the deposition reactor during formation of an AlGaAs clad layer or a DBR layer, the entire deposition reactor needs to be periodically disassembled and cleaned.

However, this method requires an additional apparatus to increase cost and reduces process speed to lower efficiency. In addition, skilled human power is needed.

Further, since a layer forming process is stopped and then resumed, a semiconductor material layer may have defects or be contaminated with impurities, thus degrading the reproducibility or reliability of laser diodes.

SUMMARY OF THE INVENTION

The present invention provides a method of fabricating a laser diode, which can improve the optical characteristics of an InGaAsN quantum well (QW) layer. In this method, a process of forming an Al-containing semiconductor material layer and a process of forming the InGaAsN QW layer can be performed in a single deposition reactor.

According to an aspect of the present invention, there is provided a method of fabricating a laser diode including a lower Al-containing semiconductor material layer, a active layer, and an upper Al-containing semiconductor material layer. The method includes thermally cleaning the inside of a deposition reactor in which a substrate on which the lower Al-containing semiconductor material layer is stacked is loaded. The thermally cleaning of the inside of the deposition reactor comprises thermally treating the inside of the deposition reactor at a predetermined temperature in an atmosphere of a gas mixture of $AsH_3$ and $H_2$ that is injected into the deposition reactor.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
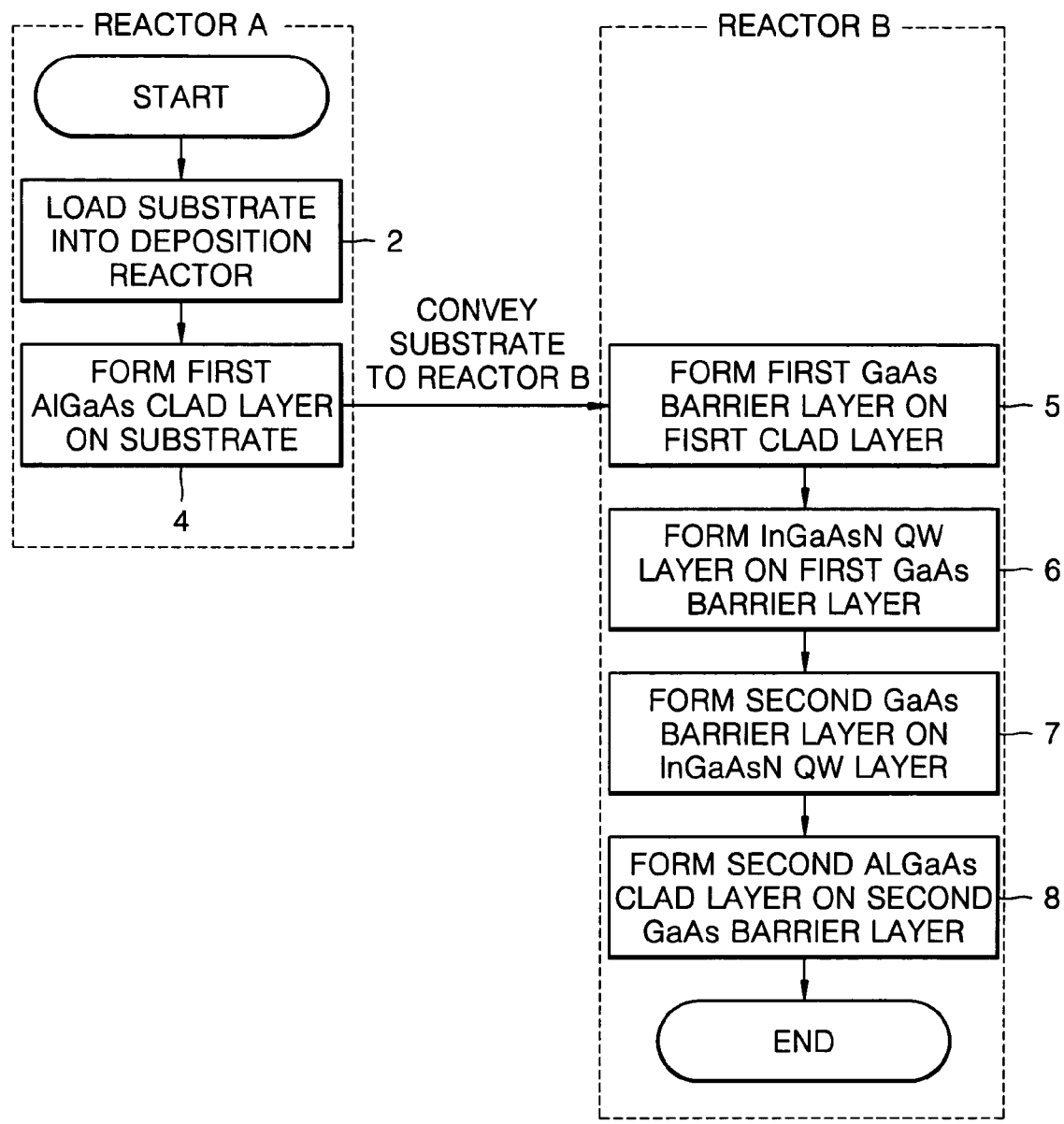
FIG. 1 is a flowchart illustrating a method of fabricating a conventional laser diode.
Figure 2:
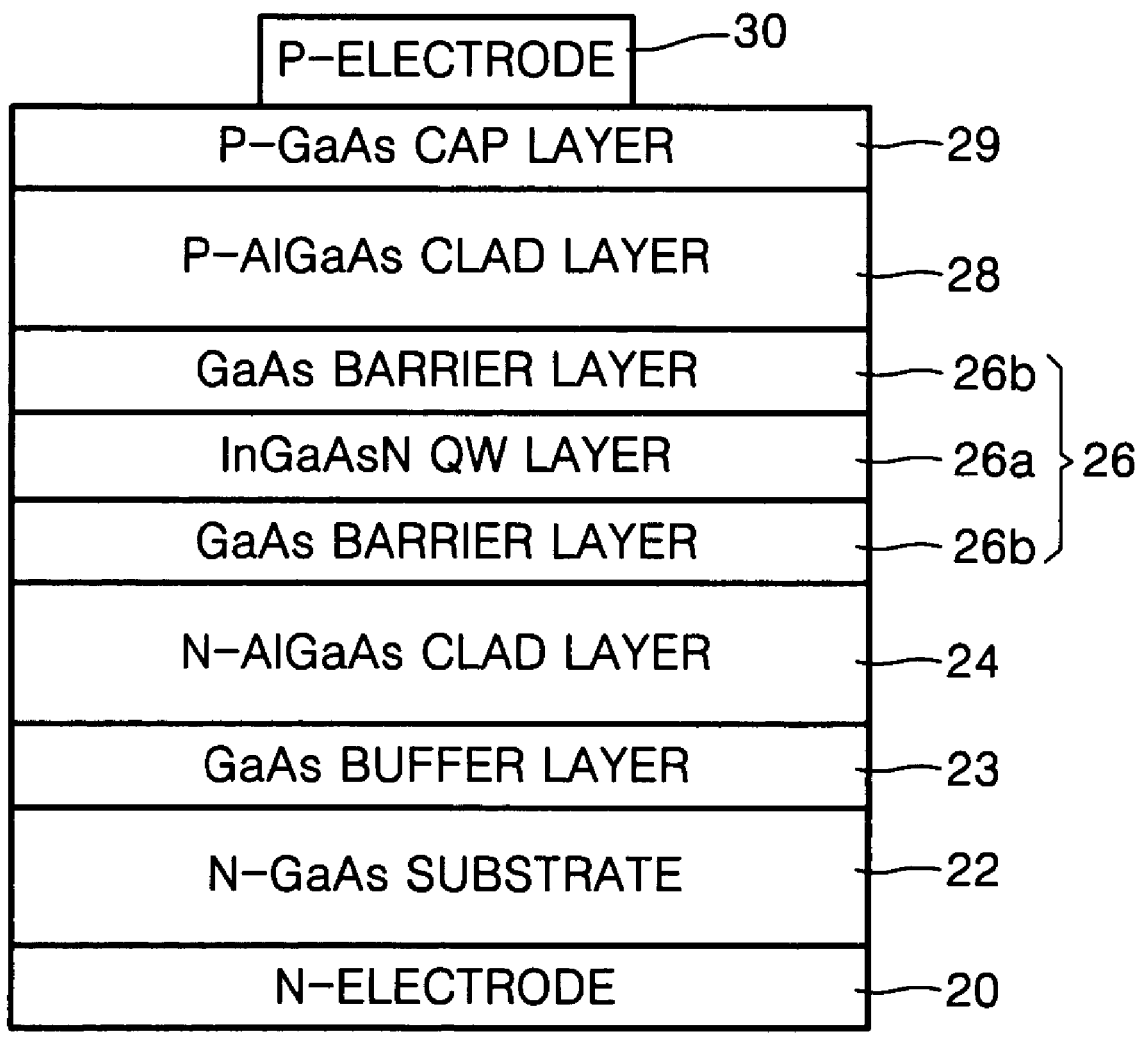
FIGS. 2 and 3 are cross-sectional views of laser diodes formed according to the present invention.
Figure 3:
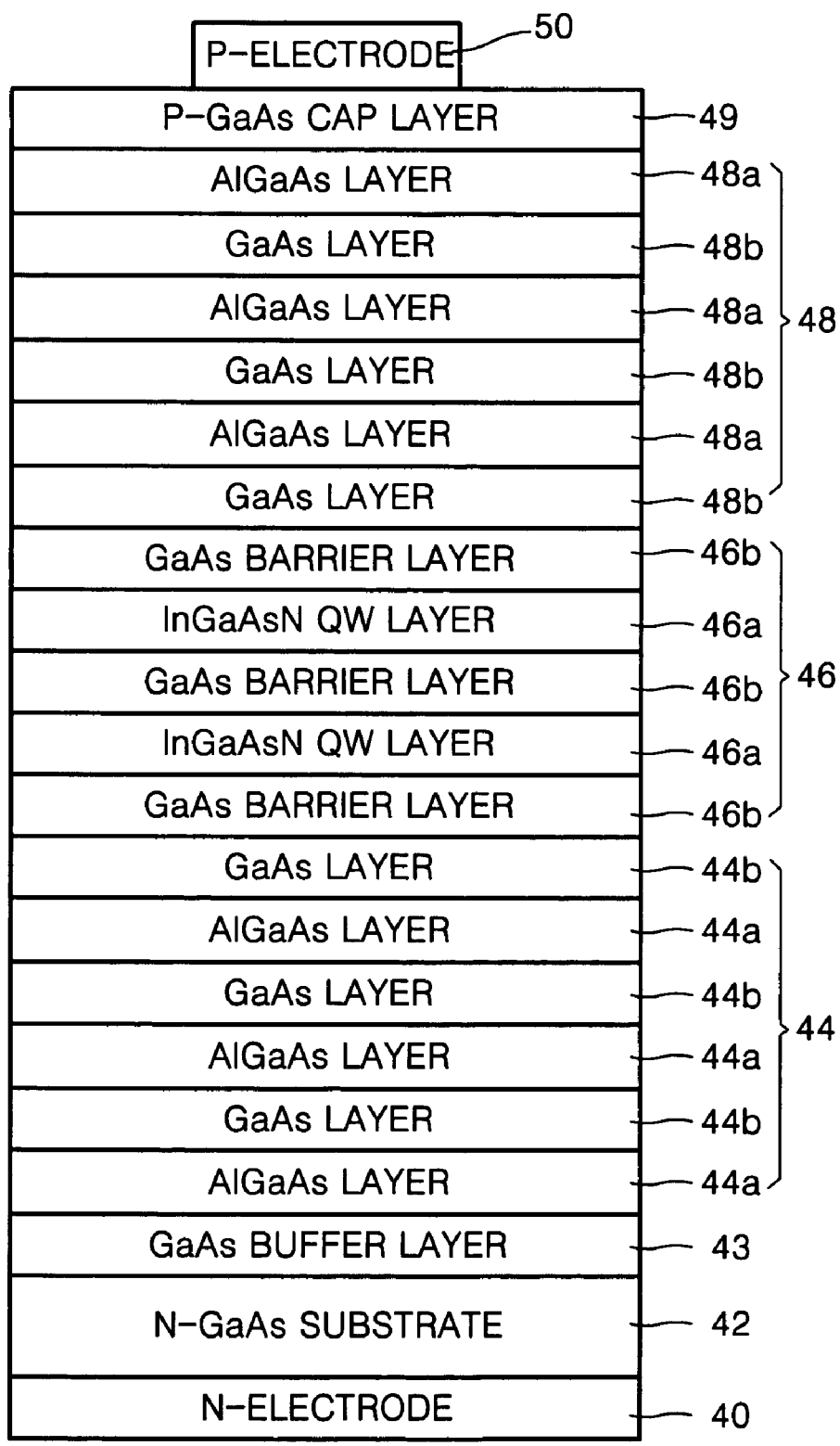

FIGS. 2 and 3 are cross-sectional views of laser diodes formed according to the present invention.

Referring to FIG. 2, a laser diode includes a GaAs buffer layer 23, an n-type AlGaAs clad layer 24, an active layer 26, a p-type AlGaAs clad layer 28, and a p-type GaAs cap layer, which are sequentially stacked on an n-type GaAs substrate 22.

An n-type electrode 20 is disposed under the n-type GaAs substrate 22, and a p-type electrode 30 is disposed on the p-type GaAs cap layer.

Also, the active layer 26 includes an InGaAsN quantum well (QW) layer 26a and GaAs barrier layers 26b disposed between the InGaAsN QW layer 26a and the n-type and p-type AlGaAs clad layers 24 and 28, respectively.

Referring to FIG. 3, a laser diode includes a GaAs buffer layer 43, a lower distributed brag reflection (DBR) layer 44, an active layer 46, an upper DBR layer 48, and a p-type GaAs cap layer 49, which are sequentially stacked on an n-type GaAs substrate 42.

An n-type electrode 40 is disposed under the n-type GaAs substrate 42, and a p-type electrode 50 is disposed on the p-type GaAs cap layer 49.

The active layer 46 includes InGaAsN QW layers 46a and GaAs barrier layers 46b. The GaAs barrier layers 46b are stacked between the InGaAsN QW layers 46a, between one InGaAsN QW layer 46a and the lower DBR layer 44, and between the other InGaAsN QW layers 46a and the upper DBR layer 48.

The lower DBR layer 44 includes AlGaAs layers 44a and GaAs layers 44b, which are alternately stacked. Likewise, the upper DBR layer 48 includes AlGaAs layers 48a and GaAs layers 48b, which are alternately stacked.

Figure 4:
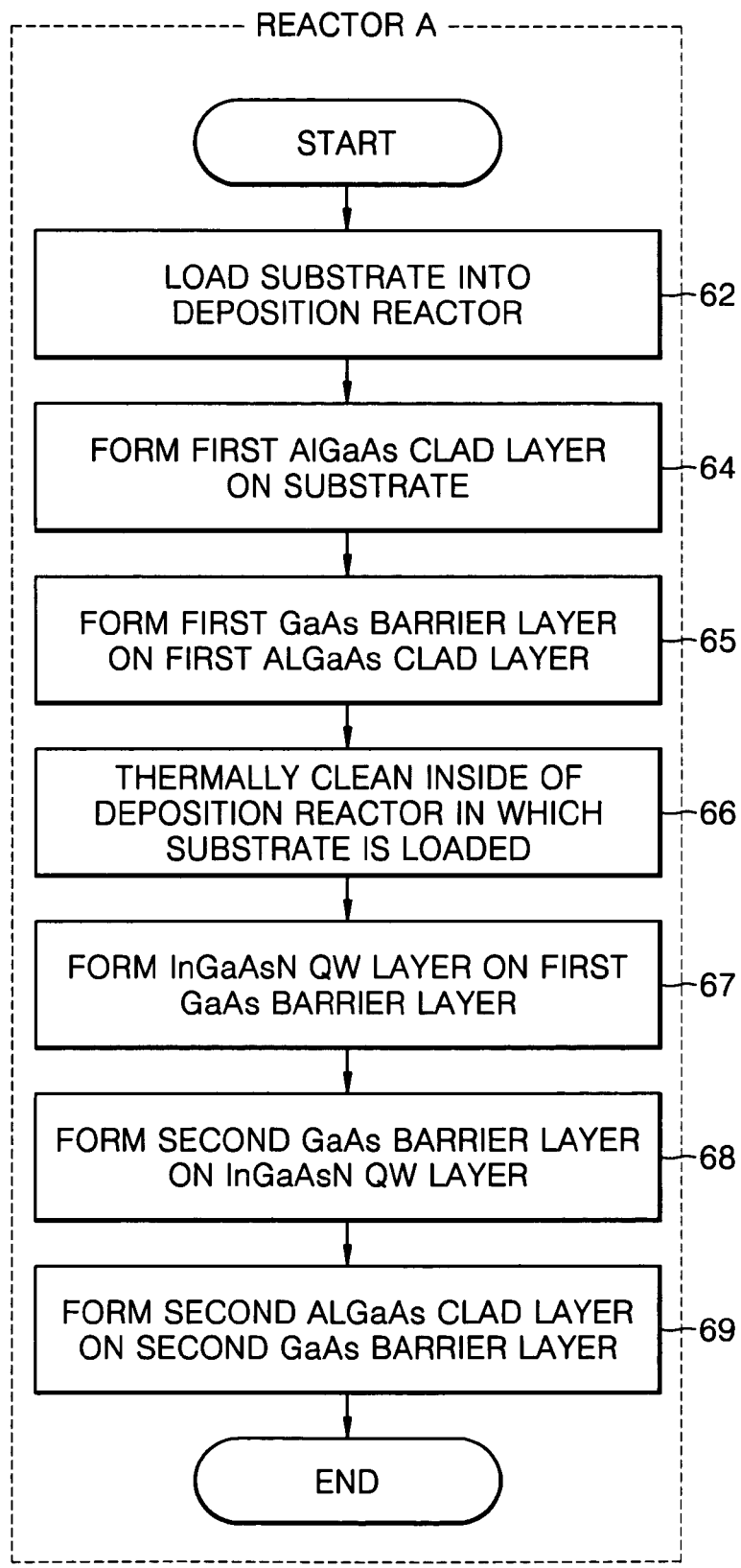
FIG. 4 is a flowchart illustrating a method of fabricating a laser diode according to an embodiment of the present invention.

FIG. 4 is a flowchart illustrating a method of fabricating a laser diode according to an embodiment of the present invention.

Referring to FIG. 4, a substrate is loaded into a deposition reactor A in operation 62, and an Al-containing semiconductor material layer, i.e., a first AlGaAs clad layer, is formed on the substrate in operation 64. Then, a first GaAs barrier layer is formed on the first AlGaAs clad layer in operation 65.

While the Al-containing semiconductor layer, i.e., the AlGaAs clad layer is being formed, an Al source is injected into the deposition reactor A. Thus, some of the Al source, which does not contribute to the formation of the semiconductor material layer, is not exhausted out of the deposition reactor A but remains inside the deposition reactor A. The remaining Al source may remain on an inner surface of the deposition reactor A or on the surface of the already formed semiconductor layer.

As described in the Background of the Invention, Al remaining in the deposition reactor A may combine with N that is a source element of an InGaAsN QW layer during a subsequent process of forming the InGaAsN QW layer, thereby degrading the optical characteristics of the InGaAsN QW layer.

The optical characteristics of the InGaAsN QW layer may be degraded particularly when a process of forming the semiconductor material layer, i.e., the AlGaAs clad layer and a process of forming the InGaAsN QW layer on the semiconductor material layer are performed in a single deposition reactor.

Therefore, according to the present invention, before the InGaAsN QW layer is formed, a process of thermally cleaning the inside of the deposition reactor A including the substrate on which the Al-containing semiconductor material layer, i.e., the first AlGaAs clad layer is stacked is additionally performed as shown in operation 66.

In operation 66, the inside of the deposition reactor A is thermally treated at a predetermined temperature in an atmosphere of a gas mixture of $AsH_3$ and $H_2$ that is injected into the deposition reactor A.

The thermal treatment may be performed at a temperature of about 700 to 1200° C. for 6 seconds to 180 minutes. Preferably, the inside of the deposition reactor A may be thermally treated at a temperature of 850° C. for 30 minutes.

Also, each of $AsH_3$ and $H_2$ may be injected into the deposition reactor A at a flow rate of about 0.1 to 10000 sccm. Preferably, a sufficient amount of $AsH_3$ within the limited flow rate range may be injected into the deposition reactor A so as to protect the surface of the semiconductor material layer from being damaged during the cleaning process. The gas mixture may further include $SiH_4$.

If the thermal treatment is performed using the gas mixture containing $SiH_4$, Al remaining in the deposition reactor A can be removed more effectively.

$SiH_4$ may be injected into the deposition reactor A at a flow rate of about 0.1 to 10000 sccm. Preferably, $SiH_4$ may be supplied at a flow rate of 1 sccm.

By performing the thermal cleaning process shown in operation 66, Al remaining in the deposition reactor A after the forming process of the Al-containing semiconductor material layer can be effectively removed.

Also, the process of forming the Al-containing semiconductor material layer and the thermal cleaning process are performed in a single deposition reactor, i.e., the deposition reactor A.

Accordingly, any additional apparatus is not required, and the semiconductor material layer is not contaminated with impurities while a layer forming process is being stopped.

After Al remaining in the deposition reactor A is removed using the thermal cleaning process shown in operation 66, an InGaAsN QW layer is formed on the first GaAs barrier layer in operation 67.

A second GaAs barrier layer is formed on the InGaAsN QW layer in operation 68, and a second AlGaAs clad layer is formed on the second GaAs barrier layer 69.

In addition to the AlGaAs clad layer, the Al-containing semiconductor material layer may be a DBR layer or other material layers containing Al.

According to the present invention, a laser diode can be fabricated in a single deposition reactor without using additional deposition reactors. Thus, fabrication cost incurred by driving the additional deposition reactors is reduced, and process time is shortened.

Also, since a layer forming process is continuously performed in a single deposition reactor, an already formed semiconductor material layer is freed from defects and not contaminated with impurities. As a result, the optical characteristics of the InGaAsN QW layer can improve, thus enhancing the reproducibility and reliability of laser diodes.

The above-described method of fabricating a laser diode may be performed using a metal organic chemical vapor deposition (MOCVD).

Instead of a GaAs layer, the barrier layer of the present invention may be formed of at least one selected from the group consisting of a GaAs layer, a GaAsN layer, an InGaAs layer, a GaAsP layer, an InGaP layer, and an InGaAsP layer.

Accordingly, after at least one selected from the group consisting of a GaAs layer, a GaAsN layer, an InGaAs layer, a GaAsP layer, an InGaP layer, and an InGaAsP layer is formed, the thermal cleaning process may be performed.

Unlike in the above-described embodiment in which the thermal cleaning process is performed after the first GaAs barrier layer is formed on the first AlGaAs clad layer, the thermal cleaning process may be performed directly after the first AlGaAs clad layer is formed.

Therefore, the thermal cleaning process shown in operation 66 may be followed by the process of forming the first GaAs barrier layer on the first AlGaAs clad layer as shown in operation 65. As described above, in addition to a GaAs layer, the barrier layer may be formed of at least one selected from the group consisting of a GaAs layer, a GaAsN layer, an InGaAs layer, a GaAsP layer, an InGaP layer, and an InGaAsP layer.

Further, although it is described in the above-described embodiment that the QW layer is a single layer, the QW layer may be a multiple QW layer.

These various changes may be made and understandable from the above-described embodiment.

Figure 5:
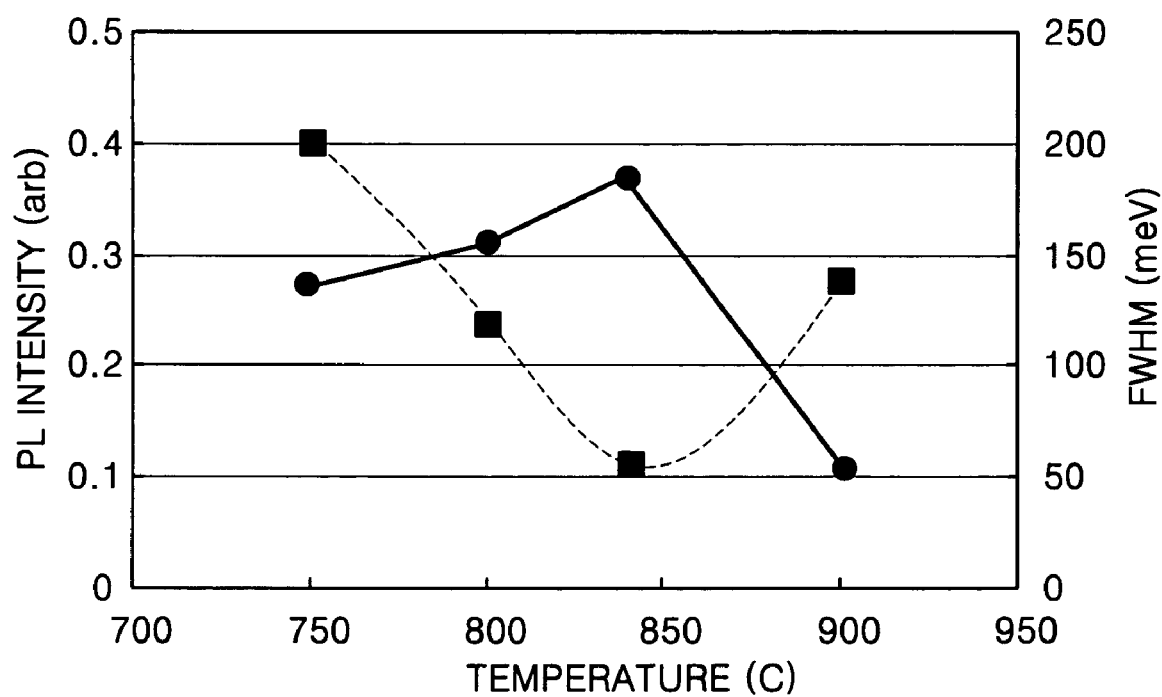
FIG. 5 is a graph showing photoluminescence (PL) intensity and full width at half maximum (FWHM) versus temperature, which is measured during fabrication of a laser diode according to the present invention.

FIG. 5 is a graph showing photoluminescence (PL) intensity and full width at half maximum (FWHM) versus temperature, which is measured during fabrication of the laser diode shown in FIG. 3.

Referring to FIG. 5, a solid line indicates a variation of PL intensity with respect to temperature at which thermal treatment is performed, and the PL intensity reaches a peak at a temperature of 850° C. A dotted line indicates a variation of FWHM with respect to temperature at which the thermal treatment is performed, and the FWHM reaches a minimum value at the temperature of 850° C. Accordingly, when the thermal treatment is performed at the temperature of 850° C., a laser diode having the best PL characteristic can be obtained.

However, in a conventional method of fabricating a laser diode, PL was not measured from a laser diode, which is obtained by performing layer forming processes in a single deposition reactor without a thermal cleaning process.

As described above, the method of the present invention includes a process of thermally cleaning Al that remains in a deposition reactor during a layer forming process. Thus, a laser diode can be fabricated in a single deposition reactor without using an additional deposition reactor.

As a result, fabrication cost incurred by driving the additional deposition reactor can be reduced, and process time can be shortened.

Also, since a layer forming process is not stopped but continues in a single deposition reactor, an already formed semiconductor material layer is freed from defects and not contaminated with impurities. Consequently, the optical characteristics of an InGaAsN QW layer can improve, thereby enhancing the reproducibility and reliability of laser diodes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a laser diode including a lower Al-containing semiconductor material layer, an active layer, and an upper Al-containing semiconductor material layer, the method comprising:
thermally cleaning the inside of a deposition reactor in which a substrate on which the lower Al-containing semiconductor material layer is stacked is loaded,
wherein the thermally cleaning of the inside of the deposition reactor comprises thermally treating the inside of the deposition reactor at a predetermined temperature in an atmosphere of a gas mixture of $AsH_3$ and $H_2$ that is injected into the deposition reactor.

2. The method of claim 1, wherein the inside of the deposition reactor is thermally treated at a temperature of about 700 to 1200° C.

3. The method of claim 1, wherein the inside of the deposition reactor is thermally treated for 6 seconds to 180 minutes.

4. The method of claim 1, wherein each of $AsH_3$ and $H_2$ is injected into the deposition reactor at a flow rate of about 0.1 to 10000 sccm.

5. The method of claim 1, wherein the gas mixture further comprises $SiH_4$, which is injected into the deposition reactor at a flow rate of about 0.1 to 10000 sccm.

6. The method of claim 1, further comprising stacking at least one selected from the group consisting of a GaAs layer, a GaAsN layer, an InGaAs layer, a GaAsP layer, an InGaP layer, and an InGaAsP layer on the lower Al-containing semiconductor material layer.

7. The method of claim 1, after thermally cleaning the inside of the deposition reactor, further comprising stacking an InGaAsN layer on the lower Al-containing semiconductor material layer.

8. The method of claim 7, further comprising stacking at least one selected from the group consisting of a GaAs layer, a GaAsN layer, an InGaAs layer, a GaAsP layer, an InGaP layer, and an InGaAsP layer between the lower Al-containing semiconductor material layer and the InGaAsN layer.

9. The method of claim 1, wherein the lower Al-containing semiconductor material layer is stacked in the deposition reactor.

* * * * *